(12) United States Patent
Camarri et al.

(10) Patent No.: US 10,872,999 B2
(45) Date of Patent: Dec. 22, 2020

(54) OPTOELECTRONIC MODULE HAVING DUAL ENCAPSULATION WITH OPENING FOR RECEIVING AN OPTICAL ASSEMBLY

(71) Applicant: ams Sensors Singapore Pte. Ltd., Singapore (SG)

(72) Inventors: Camilla Camarri, Au (CH); Mario Cesana, Au (CH); Hartmut Rudmann, Jona (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 129 days.

(21) Appl. No.: 15/999,848

(22) PCT Filed: Feb. 17, 2017

(86) PCT No.: PCT/SG2017/050076
§ 371 (c)(1),
(2) Date: Aug. 20, 2018

(87) PCT Pub. No.: WO2017/142487
PCT Pub. Date: Aug. 24, 2017

(65) Prior Publication Data
US 2020/0127156 A1    Apr. 23, 2020

Related U.S. Application Data

(60) Provisional application No. 62/297,249, filed on Feb. 19, 2016.

(51) Int. Cl.
*H01L 31/167* (2006.01)
*H01L 25/16* (2006.01)
(Continued)

(52) U.S. Cl.
CPC .......... *H01L 31/167* (2013.01); *H01L 25/167* (2013.01); *H01L 31/02325* (2013.01); *H01L 31/18* (2013.01); *G01S 7/4813* (2013.01)

(58) Field of Classification Search
CPC ................. H01L 31/167; H01L 25/167; H01L 31/02325; H01L 31/18;
(Continued)

(56) References Cited

U.S. PATENT DOCUMENTS 6,844,562 B2    1/2005  Takaoka et al.
7,227,236 B1    6/2007  Lee et al.
(Continued)

FOREIGN PATENT DOCUMENTS

EP          1 471 730 A1   10/2004
WO    WO 2015/038064 A2    3/2015

OTHER PUBLICATIONS

ISA/AU, International Search Report for PCT/SG2017/050076 (dated Jun. 26, 2017).
(Continued)

*Primary Examiner* — Shahed Ahmed
(74) *Attorney, Agent, or Firm* — Michael Best and Friedrich LLP

(57) ABSTRACT

An optoelectronic module includes first and second optical channels having respective active optoelectronic components. A transparent encapsulation is over the active optoelectronic components, and opaque encapsulation is on the transparent encapsulation. The opaque encapsulation has a first opening over a first active optoelectronic component and a second opening over a second optoelectronic component. The opaque encapsulation forms a ledge in an area of the second opening, and an optical assembly is disposed on the ledge within the second opening over the second optoelectronic component.

14 Claims, 9 Drawing Sheets

(51) Int. Cl.
*H01L 31/0232* (2014.01)
*H01L 31/18* (2006.01)
*G01S 7/481* (2006.01)

(58) Field of Classification Search
CPC ..... H01L 31/0203–02168; H01L 25/041–043;
G01S 7/4813
See application file for complete search history.

(56) References Cited

U.S. PATENT DOCUMENTS

| | | |
|---|---|---|
| 2004/0257555 A1 | 12/2004 | Takaoka et al. |
| 2005/0073036 A1 | 4/2005 | Appelt et al. |
| 2009/0130791 A1 | 5/2009 | Kwon et al. |
| 2011/0297831 A1* | 12/2011 | Yao ..................... H01L 25/167 |
| | | 250/338.4 |
| 2011/0316108 A1 | 12/2011 | Nihei |
| 2013/0003039 A1 | 1/2013 | Wada et al. |
| 2013/0334445 A1 | 12/2013 | Tharumalingam et al. |
| 2014/0021491 A1 | 1/2014 | Meng et al. |
| 2014/0061447 A1 | 3/2014 | Campbell et al. |
| 2016/0050346 A1 | 2/2016 | Liu et al. |
| 2018/0266877 A1* | 9/2018 | Yu ......................... H01L 31/173 |

OTHER PUBLICATIONS

Heptagon Products (http://hptg.com/product/), "Sensing through Light Products—SHILAH New!" downloaded Feb. 18, 2016.

European Patent Office; Partial Supplementary European Search Report mailed in counterpart European patent application No. 17753598.6 (dated Jan. 23, 2019).

* cited by examiner

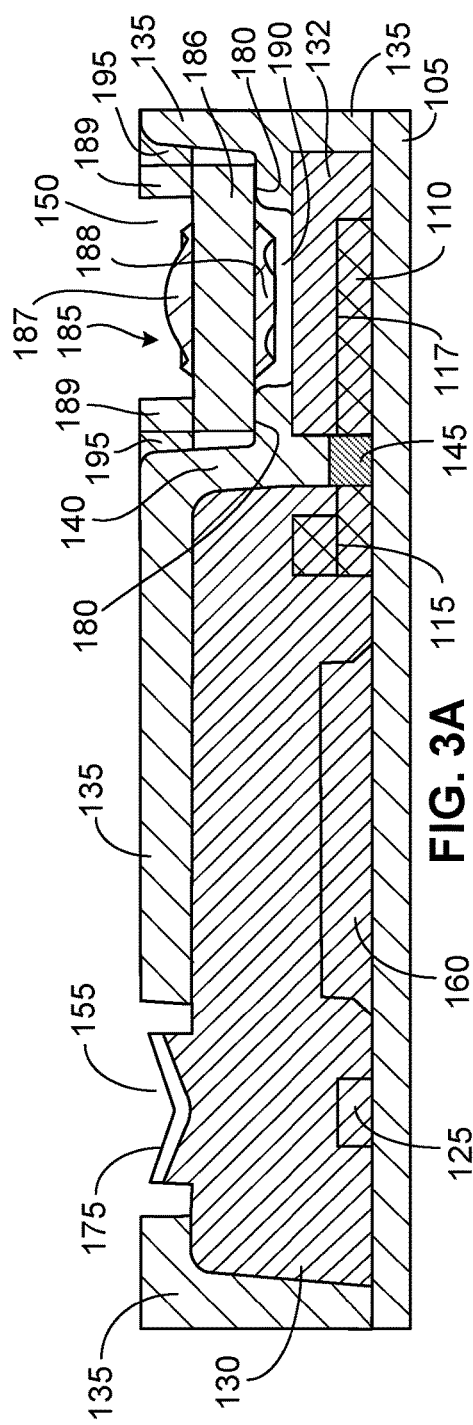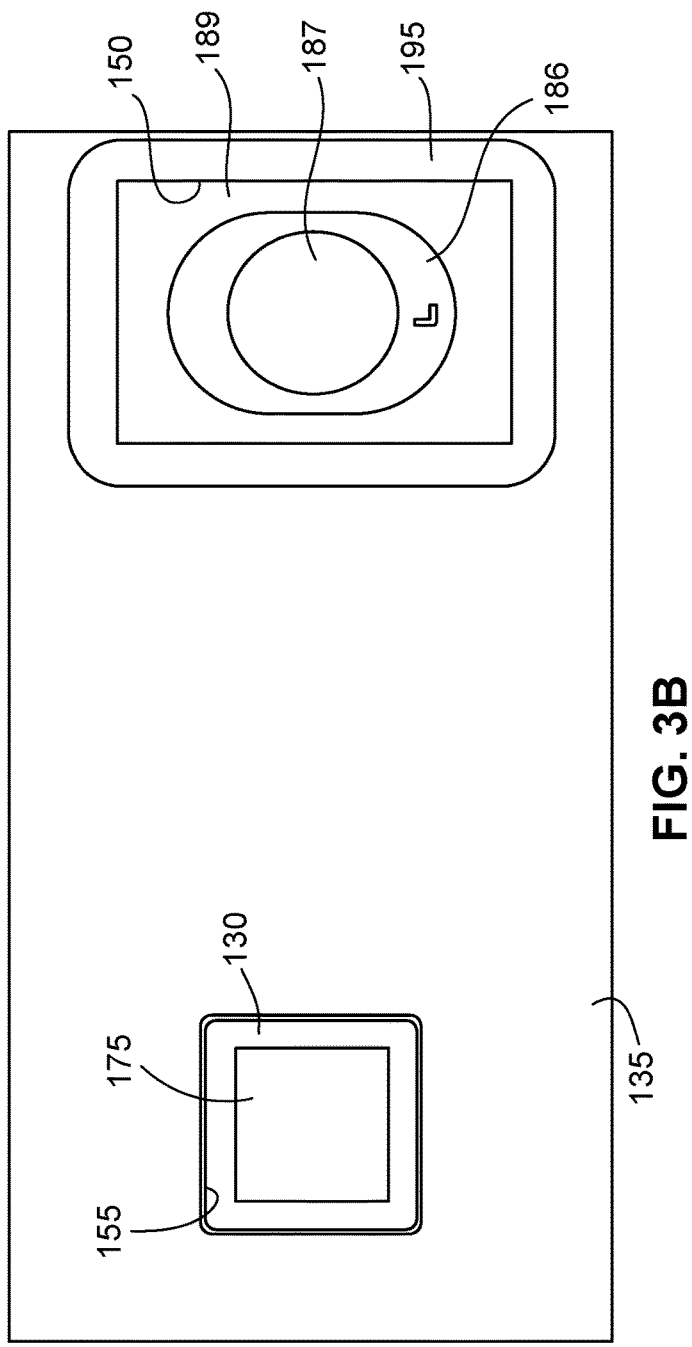

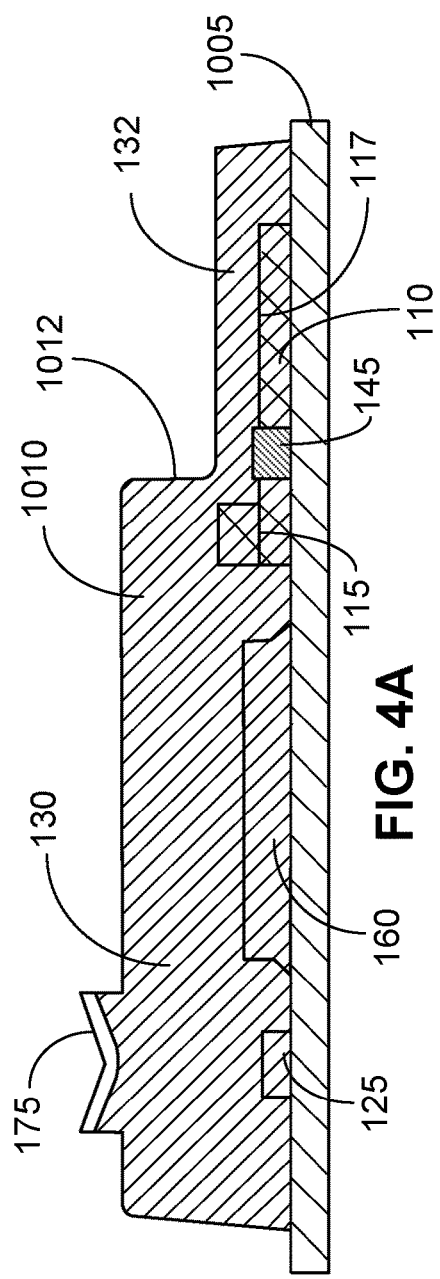
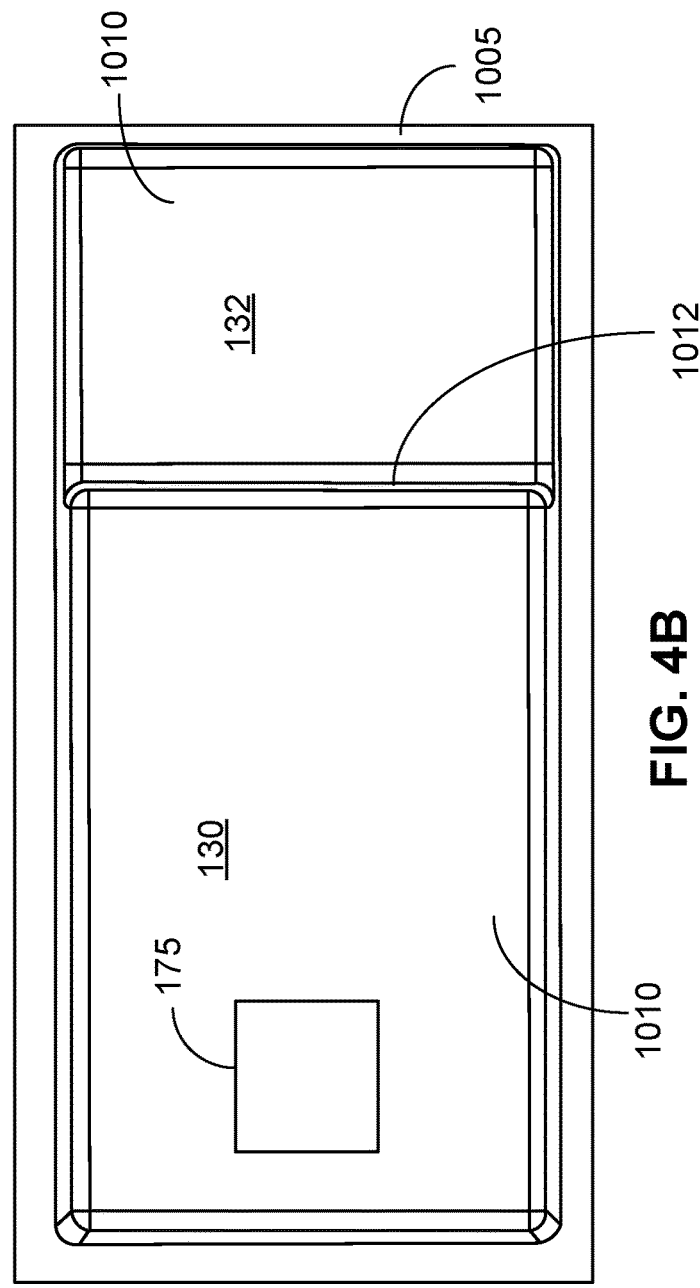

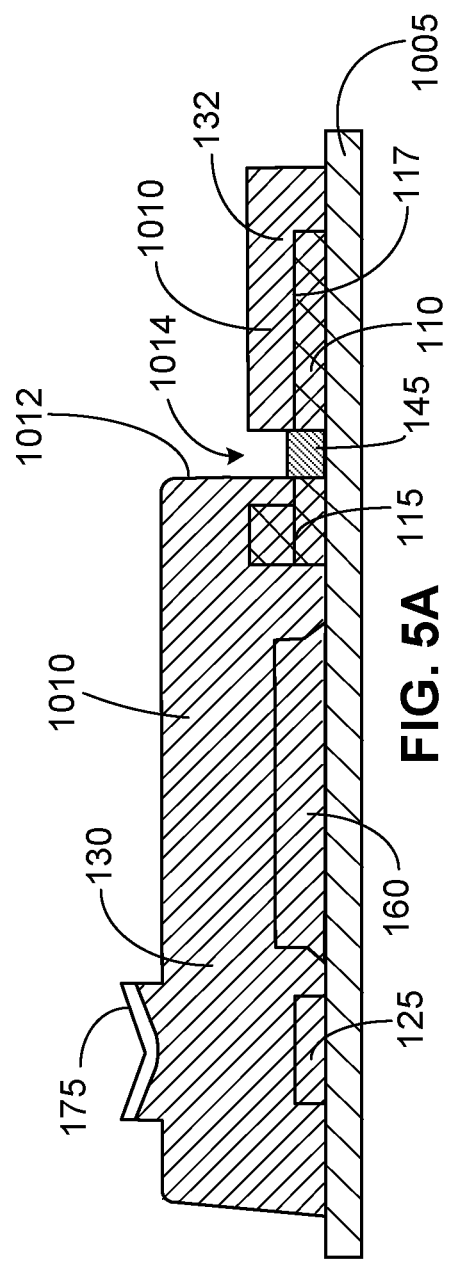
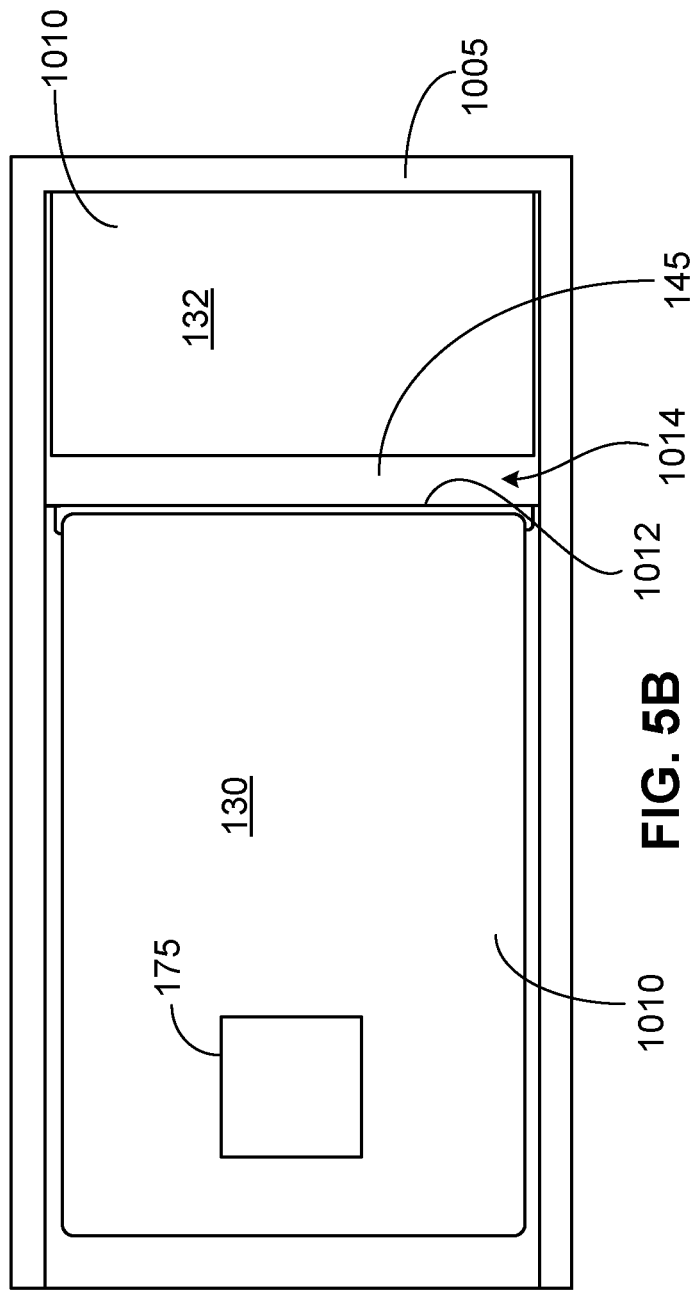

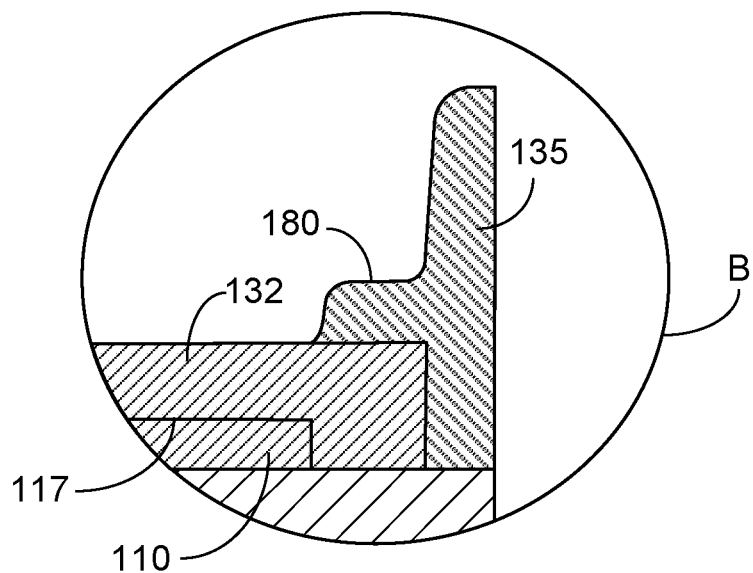
FIG. 6C
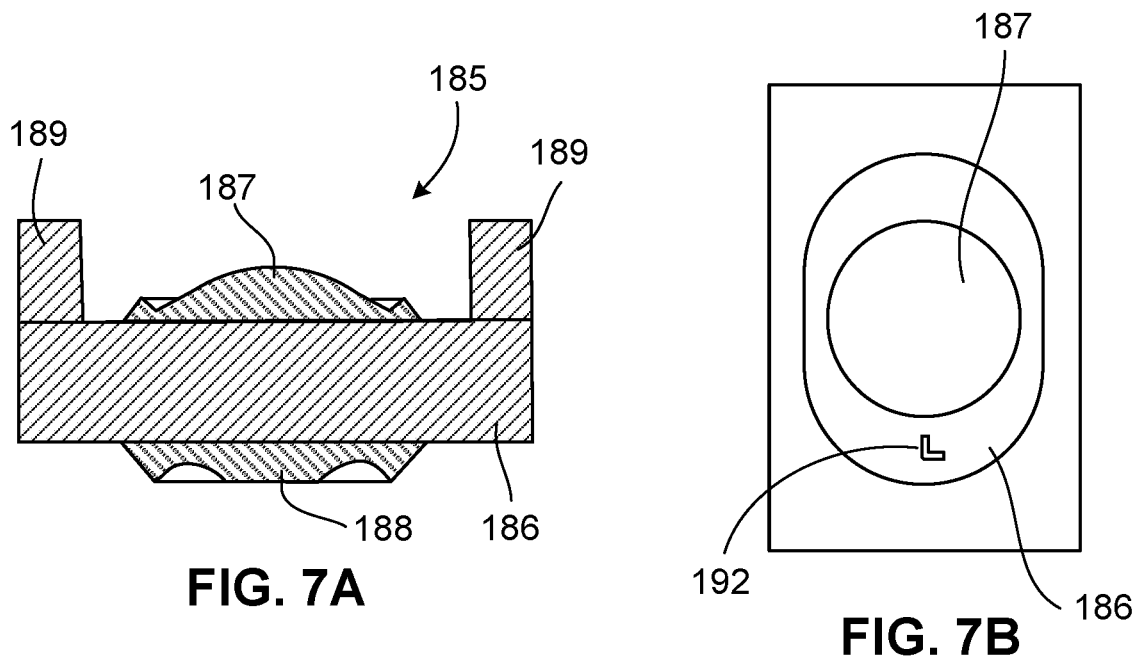
FIG. 7A
FIG. 7B

OPTOELECTRONIC MODULE HAVING DUAL ENCAPSULATION WITH OPENING FOR RECEIVING AN OPTICAL ASSEMBLY

FIELD OF THE DISCLOSURE

This disclosure relates to optoelectronic modules having a dual encapsulation with an opening for receiving an optical assembly.

BACKGROUND

Optoelectronic modules that include one or more optical radiation emitters and one or more optical sensors can be used in a wide range of applications including, for example, distance measurement, proximity sensing, gesture sensing, and imaging. In some applications, such optoelectronic modules can be included in the housings of various consumer electronics, such as mobile computing devices, smart phones, or other devices. In some cases, a clear overmold is provided over the active components (i.e., the emitter and sensor) to encapsulate the active components and protect them from dust and the like, as well as to enhance mechanical stability of the module. Further, the clear overmold can provide one or more lenses over the active components.

While such simple molded-in lenses can be useful for some applications, molded-in lenses generally have limited functionality and, thus, may not be suitable or ideal for other applications. For example, modules with more advanced functions such as focusing light onto an active component (e.g., a sensor, an array of pixels) or generating light patterns to be cast onto a scene may require more complex lenses. Further, molded-in lenses do not permit an air-gap between the lens and the underlying active optical component, which may be needed for the lens to perform a desired focusing function.

Another limitation of molded-in lenses is that the lens material is more limited. That is, the material used for the clear over-mold is also necessarily the same material as the molded-in lenses. The clear over-mold material is selected for mechanical as well as optical properties. Accordingly, there is a design tradeoff between the optical properties most suited for the molded-in lens (e.g., transmission, refractive index) and the mechanical properties (e.g., resiliency, water absorption, manufacturability). Thus, for example, an ideal lens material for some applications is glass, whereas it is not feasible to construct the clear over-mold from glass.

Further, molded-in lenses provide only a single optical surface. To improve optical performance, multiple optical surfaces may be necessary. For example, an optical stack of multiple lenses can be particularly beneficial for optical performance.

SUMMARY

The present disclosure describes optoelectronic modules that have a dual encapsulation with an opening to receive an optical assembly.

For example, in one aspect, an optoelectronic module includes first and second optical channels. A first active optoelectronic component is disposed in the first optical channel, and a second active optoelectronic component is disposed in the second optical channel. A first region of transparent encapsulation is over the first active optoelectronic component, and a second region of transparent encapsulation is over the second active optoelectronic component. The first and second regions of transparent encapsulations can be composed of the same material as one another. Opaque encapsulation is on the first and second regions of transparent encapsulation. Further, the opaque encapsulation has a first opening over the first active optoelectronic component and a second opening over the second active optoelectronic component. An optical assembly is disposed on a ledge over the second active optoelectronic component, wherein the ledge is formed by the opaque encapsulation within the area of the second opening.

Some implementations include one or more of the following features. For example, the opaque encapsulation can be molded directly to the first and second regions of transparent encapsulation. In some cases, the opaque encapsulation is an overmold on the first and second regions of transparent encapsulation. The opaque encapsulation can, in some cases, define walls and a top surface of the module.

In some implementations, the opaque encapsulation comprises, at least in part, a photo-structured, opaque coating. The first and second openings can be formed in the photo-structured, opaque coating.

The optoelectronic module can include a substrate on which the first and second optoelectronics are mounted. Further, the second region of transparent encapsulation can extend to a height above the substrate less than a height to which first region of transparent encapsulation extends.

In some instances, one of the active optoelectronic components comprises an optical emitter, and the other one of the active optoelectronic components comprises an optical sensor. Thus, in some cases, the first active optoelectronic component comprises an optical emitter, and the second active optoelectronic component comprises an optical sensor. The first and second transparent encapsulations can be substantially transparent to a wavelength of light emitted by the optical emitter.

In some implementations, the first region of transparent encapsulation over the first active optoelectronic component includes a passive optical element operable to modify a property of light passing through the passive optical element.

In another aspect, the disclosure describes a wafer-level method of fabricating optoelectronic modules. The method includes providing a substrate wafer having a front surface on which are mounted a plurality of a first type of optoelectronic components (e.g., optical emitters) and a plurality of a second type optoelectronic components (e.g., optical sensors). A transparent encapsulation is provided over the optoelectronic components. An opaque encapsulation is provided on the transparent encapsulation. The opaque encapsulation has a respective first opening over each of the first type of optoelectronic components and a respective second opening over each of the second type of optoelectronic components. The method includes placing a respective optical assembly within each second opening.

Various advantages can be achieved in some implementations. For example, in some cases, the modules described here can achieve one or more of the following: 1) they can permit an air-gap between an active component (e.g., optical sensor) and the lower optical surface of the optical assembly; 2) the optical elements (e.g., lenses) of the optical assembly can be constructed of a wider choice of suitable material; 3) the optical assembly can be relatively complex and can include, for example, multiple lenses.

Other aspects, features and advantages will be readily apparent from the following detailed description, the accompany drawings and the claims.

BRIEF DESCRIPTION OF THE DRAWINGS

FIG. 3A is a cross-sectional side view of the optoelectronic module taken along line A-A of FIG. 1.

FIG. 3B is a top view of the optoelectronic module of FIG. 1.

FIGS. 4A and 4B depict, respectively, a cross-sectional side view and a top view after formation of a transparent encapsulation.

FIGS. 5A and 5B depict, respectively, a cross-sectional side view and a top view after formation of a trench in the transparent encapsulation.

FIG. 6C is an enlarged view of section B in FIG. 6A.

FIGS. 7A and 7B depict, respectively, a cross-sectional side view and a top view of an assembly of passive optical elements.

DETAILED DESCRIPTION

Figure 1:
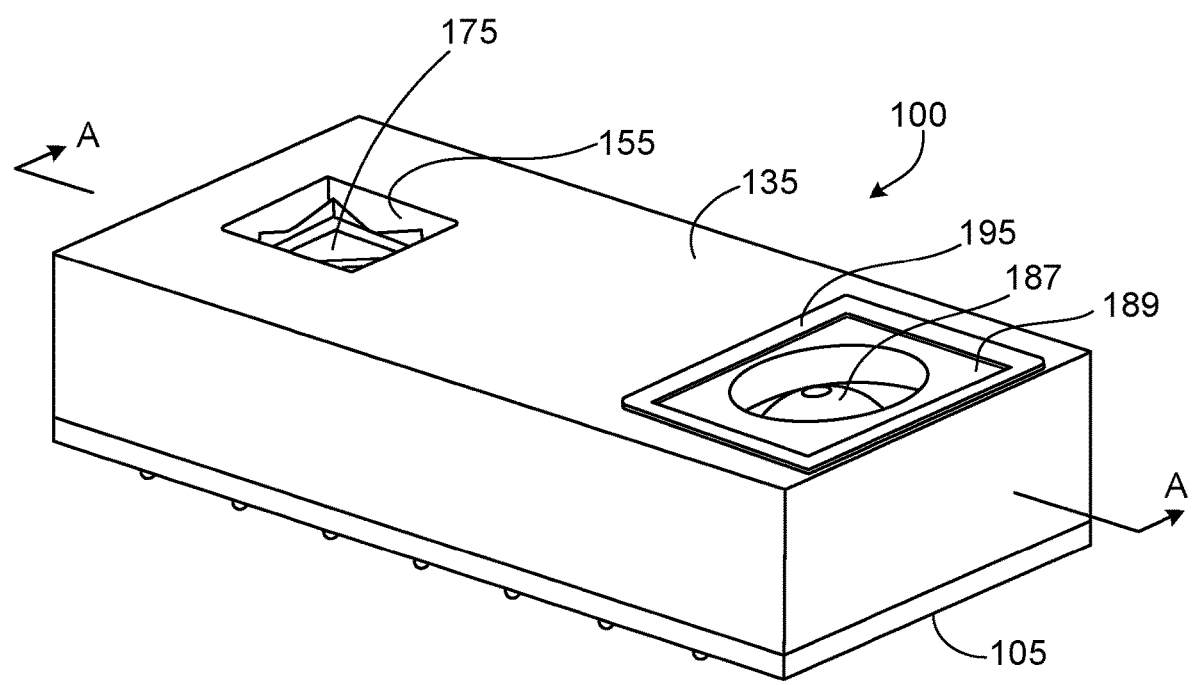
FIG. 1 illustrates an example of an optoelectronic module.
Figure 2:
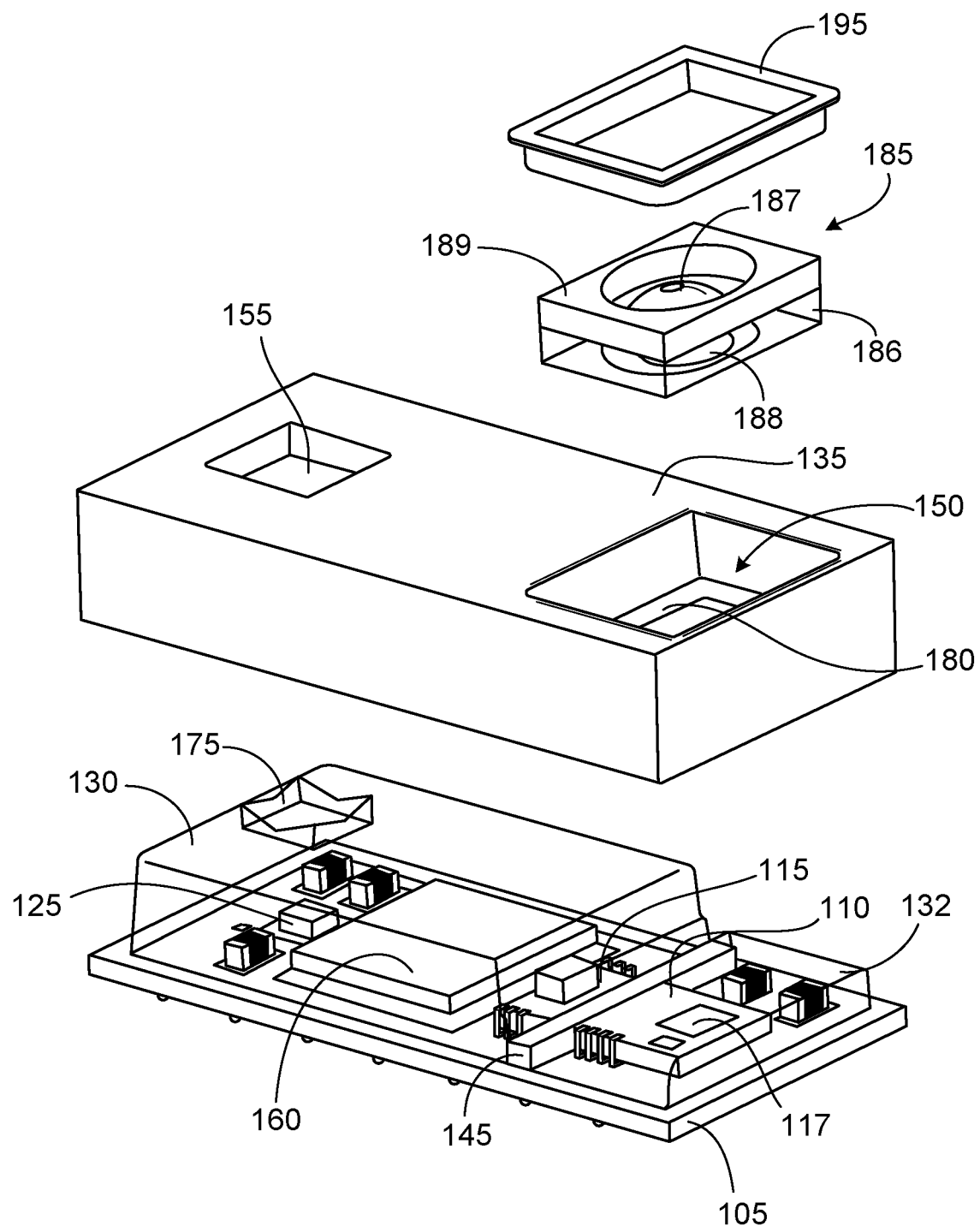
FIG. 2 illustrates an exploded view of the optoelectronic module.

The present disclosure describes optoelectronic modules that include multiple optical channels, each of which includes an active optoelectronic component (e.g., an optical emitter or optical sensor). A transparent encapsulation is provided over each of the active components, and an opaque encapsulation is provided over the transparent encapsulation. The opaque encapsulation, which can serve as the sidewalls and cover for the module, includes at least one opening to receive and hold an assembly of one or more passive optical elements (e.g., lenses) disposed over one of the active components. The encapsulations can be implemented, for example, as overmolds, with the opaque overmold material molded directly onto the transparent overmold material.

As shown in the example of FIGS. 1, 2, 3A and 3B, optoelectronic module 100 includes a printed circuit board (PCB) or other substrate 105. Optical sensor chip 110 is mounted to the front surface of substrate 105 and can include main optical sensor 117 and reference optical sensor 115. Optical sensor chip 110 can be, for example, a time-of-flight (TOF) optical sensor chip or other image sensor chip (e.g., a CMOS or CCD image sensor) that includes an array of light sensitive pixels.

Optical emitter chip 125 is mounted to the front surface of substrate 105. Optical emitter chip 125 can be, for example, a light emitting diode (LED), infra-red (IR) LED, organic LED (OLED), infra-red (IR) laser, vertical cavity surface emitting laser (VCSEL), or other optical radiation source. Opaque dam 145, which is disposed across module 100 on a front surface of optical sensor chip 110 and the front surface of substrate 105, can pass between, and separate, main optical sensor 117 and reference optical sensor 115. Preferably, opaque dam 145 is substantially opaque to wavelengths of light emitted by optical emitter chip 125, in order to at least substantially attenuate or prevent light emitted from optical emitter chip 125 from passing through opaque dam 145. Opaque dam 145 can be composed, for example, of an opaque epoxy.

Integrated circuit chip 160 also is mounted to the front surface of substrate 105. Integrated circuit chip 160 is operable to control emissions by optical emitter chip 125 and process information received from main optical sensor 117 and reference optical sensor 115. In some implementations, integrated circuit chip 160 controls optical emitter chip 125 and processes information received from main optical sensor 117 and reference optical sensor 115 to detect proximity between optical device 100 and an object outside the module 100.

First transparent encapsulation 130 is disposed over and encapsulates optical emitter chip 125 and at least a portion of optical sensor chip 110, including reference optical sensor 115. Transparent encapsulation block 130 can be formed, for example, by hardening or curing a liquid polymeric material such as epoxy. Transparent encapsulation 130 is substantially transparent to at least particular wavelengths of light (e.g., infra-red) emitted by optical emitter chip 125.

Second transparent encapsulation 132 is disposed over and encapsulates at least a portion of optical sensor chip 110, including main optical sensor 117. Second transparent encapsulation 132 extends to a height above the substrate 105 less than the height to which first transparent encapsulation 130 extends. As explained in greater detail below, this allows an assembly of one or more passive optical elements to be positioned over the main optical sensor 117, without increasing the overall height of the module 100. Second transparent encapsulation 132 also can be formed, for example, by hardening or curing a liquid polymeric material such as epoxy and can be transparent to at least particular wavelengths of light (e.g., infra-red) emitted by optical emitter chip 125. In the illustrated example, transparent encapsulation 130 and transparent encapsulation 132 are distinct from each other, although they can be composed of the same transparent material.

First and second transparent encapsulations 130, 132, as well as opaque encapsulation 135, can be formed, for example, as overmolds. The material for opaque encapsulation 135 can be molded directly onto first and second transparent encapsulations 130, 132.

In some implementations, transparent encapsulation 130 includes a passive optical element (e.g., a lens element) 175 formed integrally with, and composed of the same material as, the transparent encapsulation. For example, lens element 175 can be disposed directly above optical emitter chip 125 at a side of transparent encapsulation 130 opposite that of substrate 105. Lens element 175 can be configured to modify a property of light emitted by emitter chip 125, thereby serving as a transmitter lens.

Opaque encapsulation 135 encapsulates transparent encapsulation 130 and transparent encapsulation 132. Opaque encapsulation material 135 forms an outer layer of module 100, for example by extending across the top of module 100 and the sides of module 100. Opaque encapsulation material 135 can be composed, for example, of a polymer material which is substantially opaque to wavelengths of light emitted by optical emitter chip 125. Thus, opaque encapsulation 135 should substantially attenuate or prevent light emitted from optical emitter chip 125 from passing through opaque encapsulation material 135. Opaque encapsulation 135 can be composed, for example, of a flowable polymer material (e.g., epoxy, acrylate, polyurethane, or silicone) containing a non-transparent filler (e.g., carbon black, a pigment, an inorganic filler, or a dye).

Opaque encapsulation material 135 can include wall portion 140. In the illustrated example, wall portion 140 is integrally formed as part of opaque encapsulation material 135 and extends above and abuts opaque dam 145. Wall portion 140 of opaque encapsulation material 135 can be disposed between and/or divide transparent encapsulation block 130 and transparent encapsulation block 132. Thus, together opaque dam 145 and wall portion 140 physically separate module 100 into two chambers: an optical emission channel and an optical detection channel. The opaque dam 145 and wall portion 140 can prevent optical crosstalk between the two channels.

Opaque encapsulation 135 has first opening 155 disposed over passive optical element 175 and optical emitter chip 125. First opening 155 provides a window to allow light from optical emitter chip 125 to pass out of module 100.

Opaque encapsulation 135 also has second opening 150 disposed above main optical sensor 117. Part of opaque encapsulation 135 forms a ledge 180 within second opening 150. An optical assembly 185, including a stack of one or more passive optical elements (e.g., lenses), is disposed above main optical sensor 117 and rests on ledge 180. Optical assembly 185 thus can serve as a receiver lens assembly.

Figure 7C:
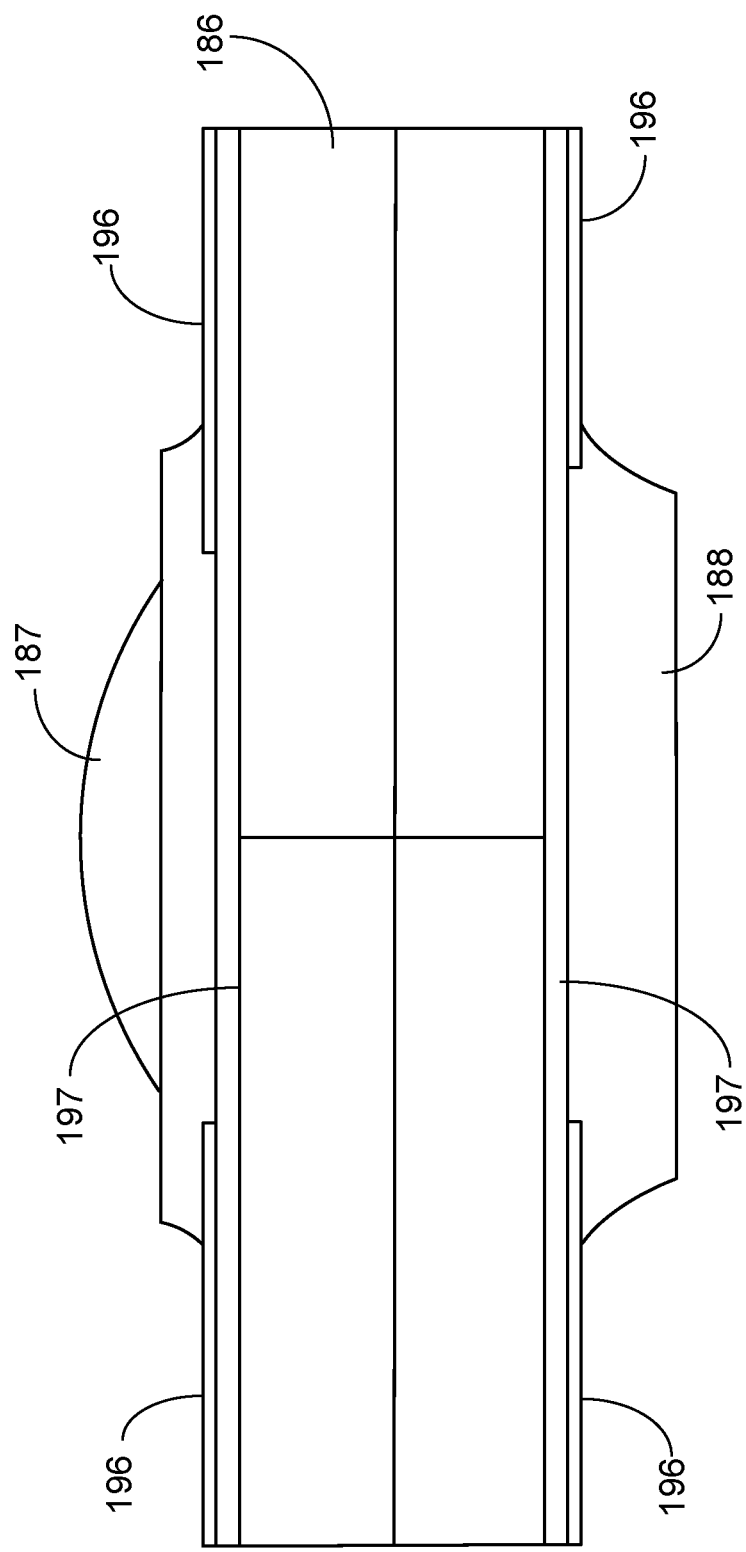
FIG. 7C illustrates a side view of another example of an optical assembly.

In the illustrated example, optical assembly 185 includes optical substrate 186 to which are attached upper lens element 187 and lower lens element 188. Optical substrate 186 can be composed, for example, of glass. Optical assembly 185 also includes baffle 189. The upper edge of baffle 189 can be at the same height as the upper surface of the opaque encapsulation 135. In some implementations, optical assembly 185 includes a different number of lens elements (e.g., only one or more than two) or may have a different arrangement of optical elements. The configuration allows an air gap 190 to be present between the lower surface of the optical assembly (i.e., lower lens element 188) and the upper surface of second transparent encapsulation 132 over main optical sensor 117. Optical assembly 185 also can include baffle 189. In some implementations, as shown in FIG. 7C, surfaces of optical substrate 186 can be coated with an opaque material to form blocking portions 196, for example, near the periphery of substrate 186. In some cases, one or both surfaces of optical substrate 186 are coated with a spectral filter (e.g., an IR filter coating) 197. For this purpose, a glass with an IR coating can be provided over main optical sensor 117.

Sealing 195, which can be composed, for example, of glue or other adhesive, laterally surrounds the upper section of optical assembly 185 (e.g., baffle 189) and retains optical assembly 185 in place within second opening 150 above main optical sensor 117.

Incorporating optical assembly 185 into module 100 as a component separate from the transparent encapsulation 132 can provide various advantages in some implementations. For example, the configuration can achieve one or more of the following: 1) it can permit an air-gap 190 between the active component 117 and the lower optical surface of optical assembly; 2) the lenses 187, 188 can be constructed of any suitable material; 3) the lens assembly 185 can be complex and can include multiple lenses. Further, in some cases, laterally extending projections can be provided within opening 150 as means for adjusting the height of lens assembly 185.

In some instances, if optical substrate 186 is sufficiently rigid, a dielectric spectral filter can be applied to optical substrate 186. Dielectric filters typically have relatively narrow transmission ranges, which can be an advantage, for example, to reduce background light. Applying the dielectric filter to optical substrate can avoid delamination, which is more likely to occur if the dielectric filter were to be applied directly to the transparent overmold.

In some cases, multiple lens assemblies 185 as described above can be manufactured as part of a wafer-level process. In other implementations, the lens assembly 185 includes a holder and a barrel containing one or more injected molded lenses. In such implementations, the opening 150 and ledge 180 can have a circular shape. In some implementations, the barrel has a thread on its external surface, whereas the holder has a thread on its internal surface. This arrangement allows the barrel to be arranged inside the holder. Alternatively, the holder can be omitted, and a thread can be provided directly in the side walls of the opening 150. Further, optical filters or coatings also can be provided for such optical assemblies. In these implementations, the baffle 189 can be provided separately or can be part of the holder. Further, the sealing 195 also can have a circular shape.

Module 100 can be fabricated by various techniques, an example of which is described below. In some cases, multiple modules 100 can be fabricated at the same time in parallel in a wafer-level process. In this context, a wafer refers to a substantially disk- or plate-like shaped item, its extension in one direction (z-direction or vertical direction) is small with respect to its extension in the other two directions (x- and y- or lateral directions). In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. In some implementations of a wafer level process, there can be provisions for at least ten modules in each lateral direction, and in some cases at least thirty or even fifty or more modules in each lateral direction.

FIGS. 4-6 illustrate fabrication steps in a particular wafer-level process for fabricating modules 100. Multiple opto-electronic components can be provided on the front surface of a PCB or other substrate wafer 1005 (see FIG. 4A). For example, optical sensor chips 110, integrated circuit chips 160, and optical emitter chips 125 can be provided on the front surface of substrate wafer 1005. To facilitate understanding, only a portion of the PCB wafer 1005 is shown in FIGS. 4-6 (i.e., corresponding to a single module 100). Opaque dams 145 can be dispensed across the front surface of each optical sensor chip 110 and the substrate 1005, passing between and separating the main optical sensor 117 and reference optical sensor 115. In some implementations, opaque dams 145 are dispensed using an applicator such as, e.g., a syringe. Opaque dams 145 can be composed, for example, of an opaque epoxy that is cured or otherwise hardened. Curing can be accomplished, for example, by applying energy to the material, e.g., in the form of heat and/or radiation.

As further shown in FIG. 4A, transparent encapsulation material 1010 can be molded (e.g., by injection molding) over the front surface of substrate wafer 1005 and the optical components thereon. As depicted in FIG. 4A, transparent encapsulation material 1010 encapsulates exposed portions of substrate wafer 1005, optical sensor chips 110, opaque dams 145, integrated circuit chips 160, and optical emitters chips 125. Transparent encapsulation material 1010 can be, for example, a flowable polymer material (e.g., epoxy, acrylate, polyurethane, or silicone) that is transparent to at least particular wavelengths of light emitted by optical emitter chips 125. Transparent encapsulation material 1010 can be cured, for example, by applying energy to the material, e.g., in the form of heat and/or radiation.

The portion 132 of transparent encapsulation material 1010 over the main optical sensor 117 portion of optical sensor chip 110 should extend to a height above the substrate wafer 1005 that is less than the height to which the portion 130 of transparent encapsulation material 1010 over the optical emitter chip 125 extends above the substrate wafer 1005. This can be achieved in one of several ways. For example, the transparent encapsulation material 1010 can be molded initially so as to have different heights across different parts of the substrate wafer 1005. Alternatively, the transparent encapsulation material 1010 can be molded initially to a substantially uniform height over substrate wafer 1005 and, after curing, some of the encapsulation material 1010 over the main optical sensor 117 portion of optical sensor chip 110 can be removed. The boundary between the two transparent encapsulation sections is identified by 1012 in FIGS. 4A-4B.

As depicted in FIGS. 5A-5B, portions of cured transparent encapsulation material 1010 are removed to form a groove (e.g., a trench) 1014 between the portion 130 of transparent encapsulation material 1010 for the first channel and the portion 132 of transparent encapsulation material 1010 for the second channel. Removal of portions of transparent encapsulation material 1010 can be accomplished, for instance, by a dicing process, using, e.g., a dicing saw. The dimensions of the portions of cured transparent encapsulation material 1010 removed can be controlled, for example, by adjusting the depth by which blades of the dicing saw cut, or adjusting the width of the saw blade. The dicing process thus defines first transparent encapsulation 130 and second transparent encapsulation 132, with a groove disposed between them. Dicing should not cut through opaque dams 145, because damage to the underlying optical sensor chips 110 can result. Thus, opaque dams 145 can act as a protective layer over respective optical sensor chips 110 during the dicing process.

Figure 6A:
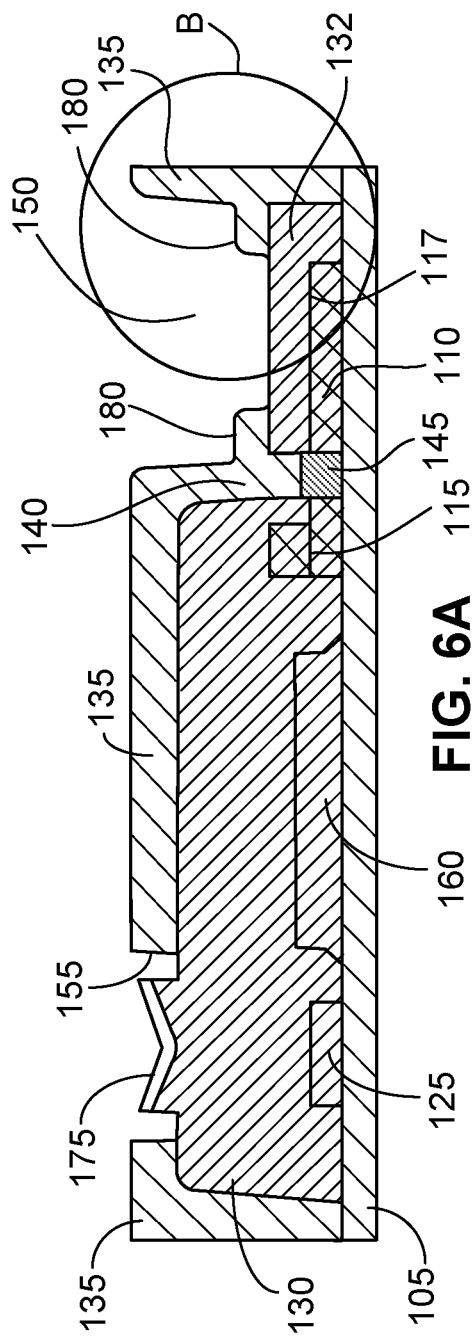
FIGS. 6A and 6B depict, respectively, a cross-sectional side view and a top view after formation of an opaque encapsulation.
Figure 6B:
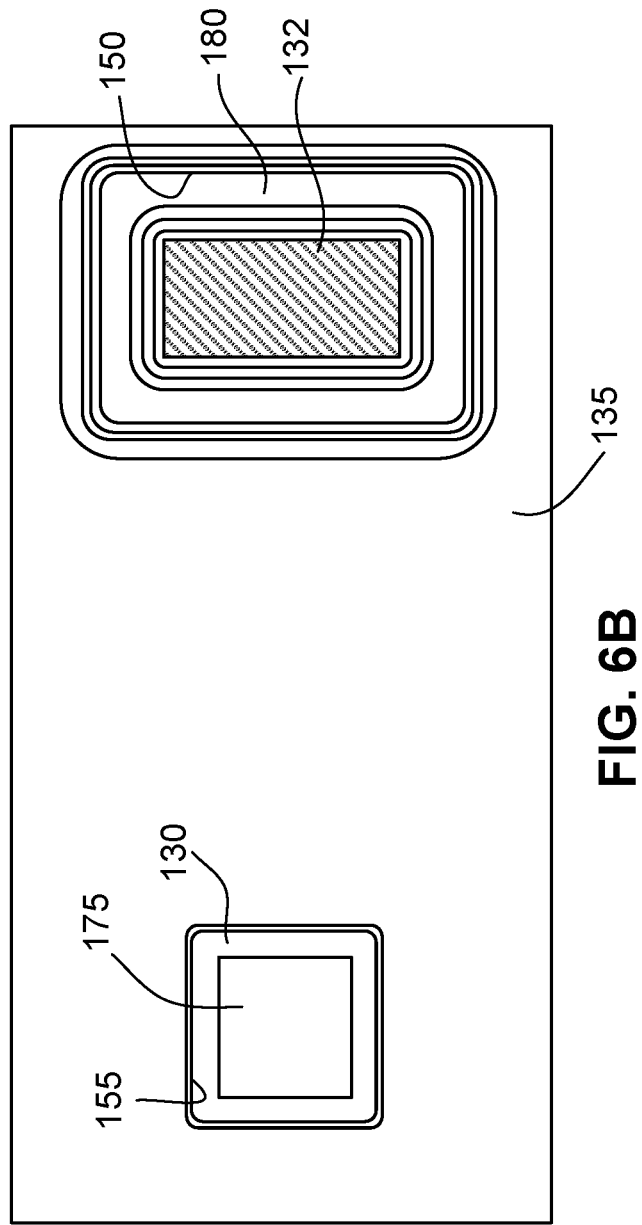

As shown in FIGS. 6A-6C, opaque encapsulation material 135 is applied to outer surfaces of transparent encapsulation 130, 132, and forms an outer layer on the surface of transparent encapsulation 130, 132. Opaque encapsulation material 135 can be composed, for example, of an epoxy or other polymer material which is substantially opaque to wavelengths of light emitted by optical emitter chip 125, in order to at least substantially interfere with or prevent light emitted from optical emitter chip 125 from passing through opaque encapsulation material 135. Opaque encapsulation 135 can be molded directly onto first and second transparent encapsulations 130, 132, for example, by an injection molding process. Opaque encapsulation 135 thus can form an overmold over first and second transparent encapsulations 130, 132.

During application, opaque encapsulation material 135 fills the groove 1014 between the region of first transparent encapsulation 130 and the region of second transparent encapsulation 132 formed during the dicing process. In this manner, a light-tight barrier can be formed between first and second transparent encapsulations 130, 132. The overmolded opaque encapsulation 135 also has first and second openings 155, 150. First opening 155 is disposed above passive optical element 175 and optical emitter chip 125, and provides a window to allow light from optical emitter chip 125 to pass out of the module. Second opening 150 is disposed above main optical sensor 117 and is configured to receive optical assembly 185. Part of opaque encapsulation 135 extends over the upper surface of optical sensor chip 110 near its periphery to form ledge 180 on which optical assembly 185 rests when placed within opening 150.

The thickness of the ledge 180 can be modified (i.e., reduced or increased), for example, to adjust the distance between the active component and optical assembly 185. Thus, in some cases, the ledge thickness can be reduced by micromachining or can be increased by injecting small portions of adhesive. In some cases, the ledge may have protrusions that can be machined to an appropriate height.

Pick and place equipment can be used to place the lens assemblies 185 within the respective openings 150. Each lens assembly 185 can include one or more alignment marks 192 (see FIG. 7B) to facilitate alignment within the opening 150. After lens assembly 185 is positioned on ledge 180, sealing glue or other adhesive 195 can be provided around the outer perimeter of the baffle 189 so as to seal the lens assembly within the opening 150.

Substrate wafer 1005 then can be separated (i.e., singulated) to produce individual singulated modules 100. Singulation can be accomplished, for example, by means of dicing, e.g., using a dicing saw. In some implementations, singulation can be accomplished by, e.g., laser cutting. Singulation can be accomplished by dicing completely through substrate 1005 and the portion of opaque encapsulation material 135 disposed above and abutting substrate 1005.

In the foregoing example, the opening 150 in the opaque encapsulation 135 to receive the optical assembly 185 is disposed in the receiver channel over main optical sensor 117. However, some implementations include an opening 2050 in the portion of opaque encapsulation 135 over optical emitter chip 125 (see FIGS. 8 and 9). This allows an optical assembly 2085 that includes, for example, one or more passive optical elements (e.g., lenses) to be disposed over the optical emitter chip 125. Optical assembly 2085, which may be more complex than the single lens 175 of FIG. 3A, can allow for more complex optical patterns to be emitted from the module and cast onto an object. Optical assembly 2085 can rest on a ledge within opening 155 in a manner similar to that described in connection with the implementation of FIG. 3A. In some cases, the optical assembly 2085 includes a barrel containing injection molded lenses as described above in connection with the implementation of FIGS. 2 and 3A-3B.

Accordingly, in some cases, the optical detection channel includes an optical assembly 185 that is separate and distinct from the transparent encapsulation 132 and rests on a ledge 180 within an opening 150 of the opaque encapsulation 135 (FIG. 3A). In such cases, the optical emission channel may include a built-in lens 175 formed in the surface of the transparent encapsulation 130.

Figure 8:
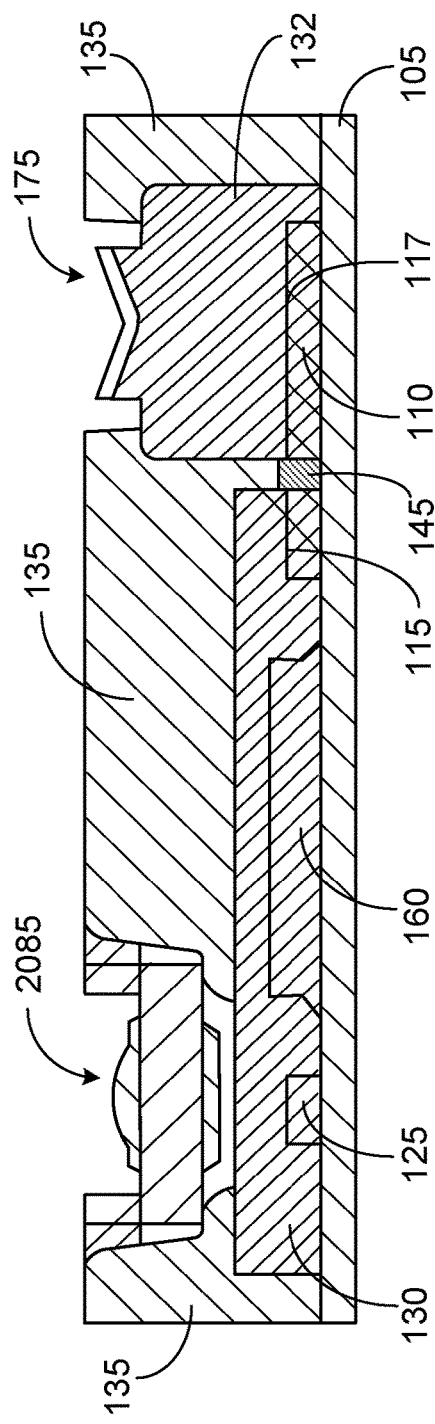
FIG. 8 illustrates a second example of an optoelectronic module.

In some cases, the optical emission channel includes an optical assembly 2085 that is separate and distinct from the transparent encapsulation 130 and rests on a ledge within an opening 2050 of the opaque encapsulation 135 (FIG. 8). In such cases, the optical detection channel may include a built-in lens 175 formed in the surface of the transparent encapsulation 132.

Figure 9:
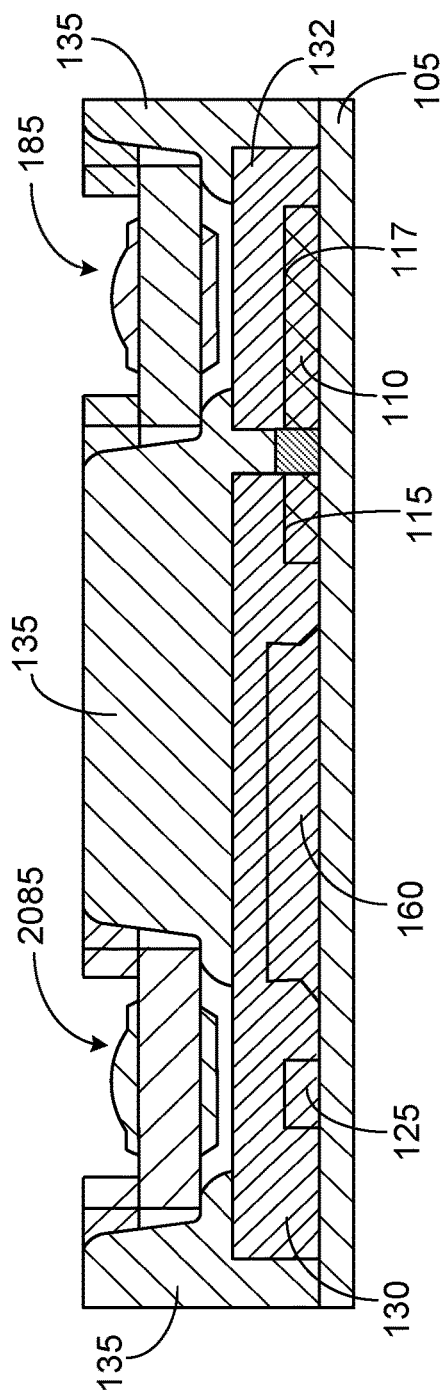
FIG. 9 illustrates a third example of an optoelectronic module.

Further, in some cases, both the optical detection channel and the optical emission channel include respective optical assemblies 185, 2085 that are separate and distinct from the transparent encapsulation 130, 132 and rest on respective ledges within openings 150, 2050 of the opaque encapsulation 135 (FIG. 9).

In modules in which the opaque encapsulation includes an opening to accommodate only one optical assembly (e.g., as in FIGS. 3A and 8), the region of transparent encapsulation (130 or 132) over which the optical assembly is disposed preferably extends to a height above the substrate 105 less than a height to which the other region of transparent encapsulation extends. Thus, in the example of FIG. 8, the first region of transparent encapsulation 130 can extend to a height above the substrate 105 that is less than the height to which the second region of transparent encapsulation 132 extends. Such features allow the overall height of the module to remain relatively small despite the presence of the optical assembly 185 or 1085.

In the foregoing examples, the overmold that forms opaque encapsulation 135 can provide the sidewalls and internal dam 145 of module 100 as well as the cover for the module. In some implementations, however, the portion of opaque encapsulation 135 that serves as the cover can be formed as a photo-structured, opaque material (e.g., black chrome). For example, a black chrome coating can be applied directly onto the top surface of the clear overmold formed by transparent encapsulations 130, 132 (including the molded-in lens 175). Radiation (e.g., UV) then can be used to structure the black chrome coating. For example, UV light can be used to establish respective apertures in the opaque coating around the molded-in lenses 175. Also, the area under the upper and lower lens elements 187, 188 respectively, can be photo-structured in a similar manner. This technique can advantageous because, in some cases, apertures can be more precisely established with the photo-structurable material than the opaque overmold (polymer) material.

As used in this disclosure, terms such as "transparent" and "opaque" are made with reference to the particular wavelength(s) emitted by or detectable by the active optoelectronic components in the module. Thus, a particular feature, for example, may be considered "non-transparent" or "opaque" even though it may allow light of other wavelengths to pass through.

Various modifications can be made within the spirit of the foregoing disclosure. Accordingly, other implementations are within the scope of the claims.

The invention claimed is:

1. An optoelectronic module comprising:
   first and second optical channels;
   a first active optoelectronic component disposed in the first optical channel;
   a second active optoelectronic component disposed in the second optical channel;
   a first region of transparent encapsulation over the first active optoelectronic component, and a second region of transparent encapsulation over the second active optoelectronic component, wherein the first and second regions of transparent encapsulations are composed of the same material as one another;
   opaque encapsulation on the first and second regions of transparent encapsulation, wherein the opaque encapsulation has a first opening over the first active optoelectronic component and a second opening over the second active optoelectronic component, the opaque encapsulation forming a ledge in an area of the second opening;
   an optical assembly disposed on the ledge within the second opening over the second active optoelectronic component; and
   a substrate on which the first and second optoelectronics are mounted,
   wherein the second region of transparent encapsulation extends to a height above the substrate less than a height to which first region of transparent encapsulation extends.

2. The optoelectronic module of claim 1 wherein the opaque encapsulation is molded directly to the first and second regions of transparent encapsulation.

3. The optoelectronic module of claim 1 wherein the opaque encapsulation is an overmold on the first and second regions of transparent encapsulation.

4. The optoelectronic module of claim 1 wherein the opaque encapsulation comprises a photo-structured, opaque coating.

5. The optoelectronic module of claim 1 wherein the first and second openings are formed in the photo-structured, opaque coating.

6. The optoelectronic module of claim 1 wherein one of the active optoelectronic components comprises an optical emitter and the other one of the active optoelectronic components comprises an optical sensor.

7. The optoelectronic module of claim 6 wherein the first and second transparent encapsulations are substantially transparent to a wavelength of light emitted by the optical emitter.

8. The optoelectronic module of claim 1 wherein the first active optoelectronic component comprises an optical emitter and the second active optoelectronic component comprises an optical sensor.

9. The optoelectronic module of claim 1 wherein the first region of transparent encapsulation over the first active optoelectronic component includes a passive optical element operable to modify a property of light passing through the passive optical element.

10. The optoelectronic module of claim 1 wherein the opaque encapsulation defines walls and a top of the module.

11. The optoelectronic module of claim 1 wherein the optical assembly includes:
    a barrel containing one or more optical elements, wherein the barrel has a thread on its external surface;
    a holder for the barrel,
    wherein the barrel is arranged within the holder such that a thread on an inner surface of the holder engages the thread of the barrel.

12. The optoelectronic module of claim 1 wherein the optical assembly includes:
    a barrel containing one or more optical elements, wherein the barrel has a thread on its external surface,
    the barrel being arranged within the second opening such that the thread on the external surface of the barrel engages an opposing thread on a sidewall of the second opening.

13. The optoelectronic module of claim 11, wherein the second opening and the ledge have a circular shape.

14. The optoelectronic module of claim 1, further comprising an opaque dam disposed on the substrate and across the optoelectronic module between the first and the second optoelectronic components, and wherein the opaque encapsulation includes a wall portion which extends above and abuts the opaque dam.

* * * * *